(12) United States Patent
Fujikawa et al.

(10) Patent No.: US 11,854,856 B2
(45) Date of Patent: Dec. 26, 2023

(54) METHOD OF MANUFACTURING SEMICONDUCTOR ELEMENT

(71) Applicant: Mitsubishi Electric Corporation, Tokyo (JP)

(72) Inventors: Masahiro Fujikawa, Tokyo (JP); Kunihiko Nishimura, Tokyo (JP); Shuichi Hiza, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 302 days.

(21) Appl. No.: 17/298,961

(22) PCT Filed: Feb. 25, 2019

(86) PCT No.: PCT/JP2019/007036
§ 371 (c)(1),
(2) Date: Jun. 2, 2021

(87) PCT Pub. No.: WO2020/174529
PCT Pub. Date: Sep. 3, 2020

(65) Prior Publication Data
US 2022/0059386 A1    Feb. 24, 2022

(51) Int. Cl.
*H01L 21/683* (2006.01)
*H01L 21/304* (2006.01)
*H01L 21/67* (2006.01)

(52) U.S. Cl.
CPC ........ *H01L 21/6835* (2013.01); *H01L 21/304* (2013.01); *H01L 21/67103* (2013.01);
(Continued)

(58) Field of Classification Search
CPC ............... H01L 21/6835; H01L 21/304; H01L 21/67103; H01L 2221/68318;
(Continued)

(56) References Cited

U.S. PATENT DOCUMENTS 6,558,975 B2 * 5/2003 Sugino .................... H01L 24/29
438/459
6,603,191 B2 * 8/2003 Wakabayashi ........ H01L 21/561
257/E23.021
(Continued)

FOREIGN PATENT DOCUMENTS

JP    2003-203886 A    7/2003
JP    2005-159155 A    6/2005

OTHER PUBLICATIONS

International Search Report and Written Opinion dated Apr. 23, 2019, received for PCT Application PCT/JP2019/007036, Filed on Feb. 25, 2019, 8 pages including English Translation.
(Continued)

*Primary Examiner* — Vu A Vu
(74) *Attorney, Agent, or Firm* — XSENSUS LLP (57) ABSTRACT

An object is to provide a technique capable of suppressing defectives in semiconductor elements. A manufacturing method of a semiconductor device includes a step of forming a laminated body in which an adhesive protective layer, an adhesive layer, a peeling layer, and a support substrate are disposed in this order on a first main surface of the semiconductor substrate, a step of removing the semiconductor substrate other than a portion where a plurality of circuit elements are formed, a step of bonding the portion where the circuit elements are formed to a transfer substrate, a step of removing the peeling layer, the support substrate and the adhesive layer, a step of removing the adhesive protective layer by chemical treatment, and a step of dividing the plurality of circuit elements.

19 Claims, 6 Drawing Sheets

(52) U.S. Cl.
CPC ............... *H01L 2221/6834* (2013.01); *H01L 2221/68318* (2013.01); *H01L 2221/68381* (2013.01)

(58) Field of Classification Search
CPC ... H01L 2221/6834; H01L 2221/68381; H01L 2221/68327; H01L 21/78; H01L 21/76256; H01L 2221/68368
USPC .......................................................... 438/464
See application file for complete search history.

(56) References Cited

U.S. PATENT DOCUMENTS

| | | | | |
|---|---|---|---|---|
| 6,982,184 | B2* | 1/2006 | Silverbrook | B81C 99/008 438/110 |
| 7,140,951 | B2* | 11/2006 | Kurosawa | H01L 21/67132 438/460 |
| 8,043,698 | B2* | 10/2011 | Morishima | H01L 21/561 428/355 R |
| 8,309,219 | B2* | 11/2012 | Hwang | C09J 7/20 438/464 |
| 2005/0095742 | A1 | 5/2005 | Silverbrook | |
| 2007/0077685 | A1 | 4/2007 | Noda et al. | |
| 2008/0318396 | A1* | 12/2008 | Shin | H01L 21/78 257/E21.211 |
| 2009/0311849 | A1* | 12/2009 | Andry | H01L 21/6836 438/464 |
| 2010/0330780 | A1 | 12/2010 | Hwang et al. | |

OTHER PUBLICATIONS

Office Action dated Jun. 29, 2023 in Chinese Patent Application No. 201980091663.X with English translation thereof, 16 pages.

\* cited by examiner

METHOD OF MANUFACTURING SEMICONDUCTOR ELEMENT

CROSS-REFERENCE TO RELATED APPLICATION

The present application is based on PCT filing PCT/JP2019/007036, filed Feb. 25, 2019, the entire contents of which are incorporated herein by reference.

TECHNICAL FIELD

The present invention relates to a method of manufacturing a semiconductor element.

BACKGROUND ART

In the field of the semiconductor industry, high-density packaging for miniaturization, thinning of semiconductor elements and improvement in heat dissipation for high performance have been required. Thinning includes mechanically and chemically polishing the rear surface of a semiconductor substrate on which circuit elements such as semiconductor patterns are formed. In order to perform the thinning, after bonding the front surface on which the semiconductor circuit elements are formed and the support substrate, it is necessary to prevent the circuit elements from being cracked or damaged, not only in the polishing step, but also in the support substrate peeling step and the dividing (cutting) step after the polishing step.

In the conventional steps of adhesion, polishing, division, peeling, followings are performed: (i) adhesion of a front surface on which a plurality of circuit elements are formed to the support substrate with an adhesive material such as a low melting point wax, an organic adhesive, an inorganic adhesive, or an adhesive tape, (ii) transferring to bond the plurality of circuit elements to another substrate after thinning (polishing) the semiconductor substrate from the rear surface, (iii) dividing the plurality of circuit elements, (iv) peeling off the support substrate from the circuit elements by photoirradiation, heating, chemical etching and the like (for example Patent Documents 1 and 2).

PRIOR ART DOCUMENTS

Patent Documents

[Patent Document 1] Japanese Patent Application Laid-Open No. 2003-203886

[Patent Document 2] Japanese Patent Application Laid-Open No. 2005-159155

SUMMARY

Problem to be Solved by the Invention

As described above, the rear surface of the semiconductor substrate is thinned after the front surface of the semiconductor substrate on which a plurality of circuit elements are formed and the support substrate are adhered to each other. If the thickness of the semiconductor substrate after thinning is 50 µm or more, the semiconductor elements can be manufactured with no defects such as damage to the circuit elements. However, when the thickness of the semiconductor substrate after thinning is about 20 µm or less, the semiconductor substrate supporting the circuit elements is almost eliminated, and the strength of circuit element is weakened. In this case, defects such as cracks, breakage, and film peeling are likely to occur in the circuit elements during division and peeling; therefore, there has been a problem that the number of defective semiconductor elements increases and the non-defective rate decreases.

The present invention has been made in view of the above problem and has an object to provide a technique capable of suppressing defectives in semiconductor elements.

Means to Solve the Problem

According to the present invention, a method of manufacturing a semiconductor element includes a step (a) of forming a laminated body in which an adhesive protective layer, an adhesive layer, a peeling layer, and a support substrate are disposed in this order on a first main surface of the semiconductor substrate on which a plurality of circuit elements are formed, a step (b) of removing the semiconductor substrate other than a portion where the plurality of circuit elements are formed, by polishing the semiconductor substrate from a second main surface opposite to the first main surface, a step (c) of bonding the portion where the plurality of circuit elements are formed to a transfer substrate, a step (d) of removing the peeling layer and the support substrate by photoirradiation of the peeling layer, a step (e) of removing the adhesive layer by heat treatment, a step (f) of removing the adhesive protective layer by chemical treatment, and a step (g) of dividing the plurality of circuit elements.

Effects of the Invention

According to the present invention, defects of a semiconductor element can be suppressed by forming the adhesive protective layer.

The objects, features, aspects, and advantages of the present invention will become more apparent from the following detailed description and the accompanying drawings.

DESCRIPTION OF EMBODIMENTS

Embodiment 1

Figure 1:
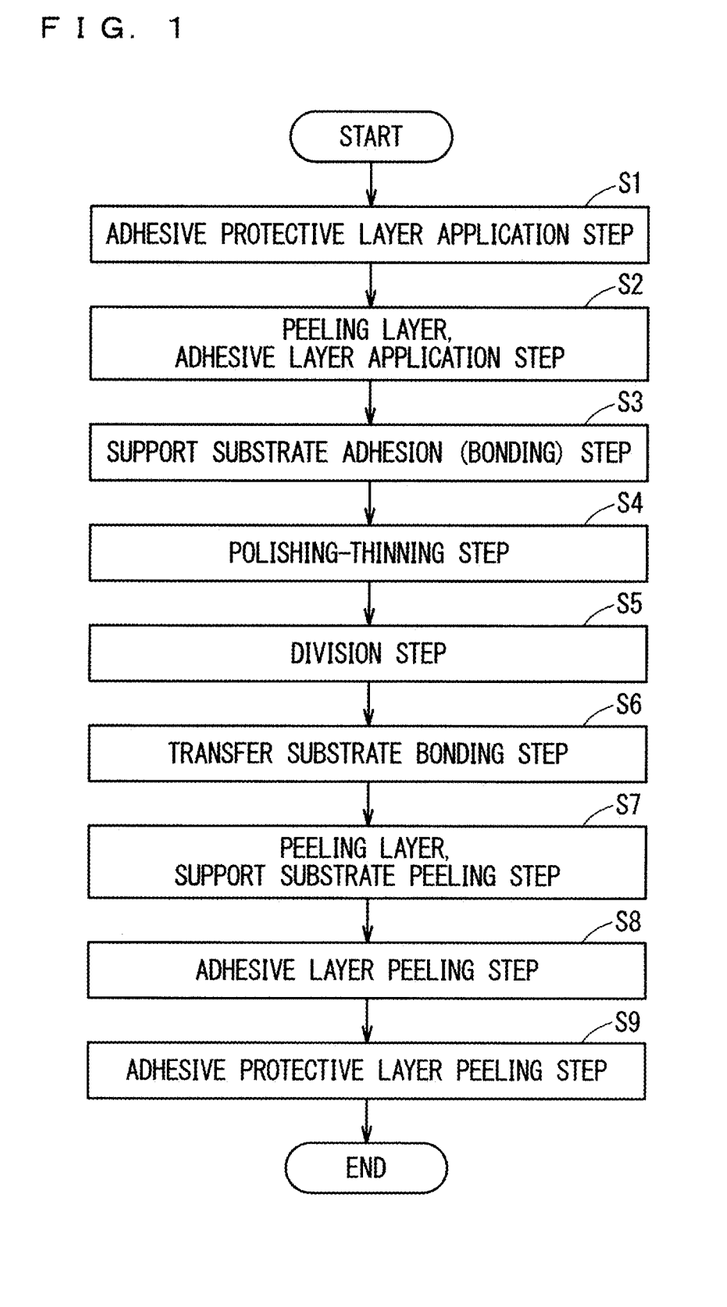
FIG. 1 A flowchart illustrating manufacturing steps for a semiconductor element according to Embodiment 1.

Next, a method of manufacturing the semiconductor device according to Embodiment 1 will be described. FIG. 1 is a flowchart illustrating manufacturing steps for a semiconductor element according to Embodiment 1. FIGS. 2 to 12 are cross-sectional views illustrating the manufacturing steps. In Embodiment 1 followings are performed: formation of an adhesive protective layer and an adhesive layer on a semiconductor substrate on which a plurality of circuit elements are formed, adhesion (bonding) of the adhesive layer and a support substrate to each other, substrate thinning (polishing), division (cutting) by dicing or the like, bonding of a transfer substrate, peeling of the support substrate, peeling of the adhesive layer, and peeling of the adhesive protective layer, in this order.

Hereinafter, as an example, a method of manufacturing for producing a high-output semiconductor element having heat dissipation efficiency improved by thinning (polishing) the rear surface of the semiconductor substrate on which a high-frequency circuit element composed of a gallium nitride semiconductor is formed, and by transferring the high-frequency circuit element to a substrate on which a diamond film is formed as a heat-dissipating substrate will be described.

Here, in order to improve the heat dissipation efficiency of the circuit element and obtain a high output, the thermal conductivity is required to be increased. To this end, it is conceivable to remove the semiconductor substrate other than the portion where the circuit element of the semiconductor substrate is formed, by thinning. However, when the thickness of the circuit element becomes about 10 µm, the strength thereof lowers, so that the circuit element and further the semiconductor element may become defective due to breakage or the like during the dividing, bonding, and peeling steps. Meanwhile, according to Embodiment 1 described below, the suppression of such defects of the semiconductor element from being produced is ensured. The following Embodiment 1 is not limited to the following method of manufacturing, and is applicable to any methods of manufacturing of a semiconductor element involving thinning (polishing) a semiconductor circuit element.

Figure 2:
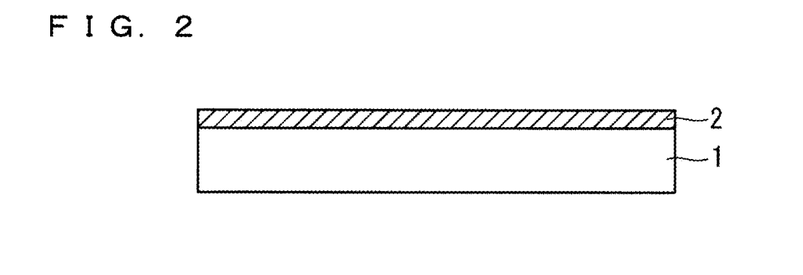
FIG. 2 A cross-sectional view illustrating the manufacturing steps for the semiconductor element according to Embodiment 1.

First, as illustrated in FIG. 2, a plurality of circuit elements 2 are formed on a first main surface (front surface) of a semiconductor substrate 1 such as a silicon wafer or a SiC (silicon carbide) wafer. A circuit element 2 includes, for example, an electrode composed of metal, an impurity region in the semiconductor substrate 1, and the like. Note that, in FIG. 2 and the like, the plurality of circuit elements 2 are simplified, and the portion where the plurality of circuit elements 2 are formed is illustrated.

Figure 3:
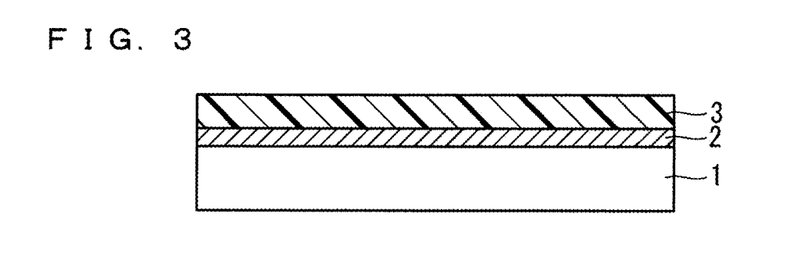
FIG. 3 A cross-sectional view illustrating the manufacturing steps for the semiconductor element according to Embodiment 1.

Next, as illustrated in FIG. 3, an adhesive protective layer 3 is formed by application on the first main surface of the semiconductor substrate 1, and the circuit elements 2 are covered with the adhesive protective layer 3 (Step S1 in FIG. 1). The adhesive protective layer 3 is a layer for reinforcing the film strength in order to prevent the circuit elements 2 thinned in a later step from being deformed or damaged due to film stress or the like, and is a layer with relatively strong adhesive strength against the circuit elements 2. When the circuit element 2 is a high-frequency circuit element including a hollow structure electrode (not illustrated) such as an air bridge structure, the electrode is protected by an adhesive protective layer 3 so as not to be damaged in a later peeling step or the like.

The adhesive protective layer 3 includes, for example, an adhesive which contains a material containing an organic solvent and a thermosetting resin or a photocurable resin and can be removed by chemical treatment. The material includes, for example, an acrylic resin, an olefin resin, a phenol resin, a polypropylene resin, a polyethylene resin and the like.

As method of applying the adhesive protective layer 3, for example, a spin coating method is used in which the adhesive to be the adhesive protective layer 3 is put on the first main surface of the semiconductor substrate 1 on which the circuit elements 2 are formed, and then is rotated at high speed with respect to the in-plane center of the semiconductor substrate 1. The coating thickness of the adhesive protective layer 3 is, for example, 5 to 8 µm. The method of applying the adhesive protective layer 3 may be a printing method, a spray method, or the like. By heating the applied adhesive protective layer 3 to 90 to 120° C. on a hot plate or the like, the solvent component of the adhesive protective layer 3 evaporates and the adhesive protective layer 3 is cured. When the adhesive protective layer 3 contains a photocurable resin, the dried adhesive protective layer 3 may be photoirradiated to be cured.

Figure 4:
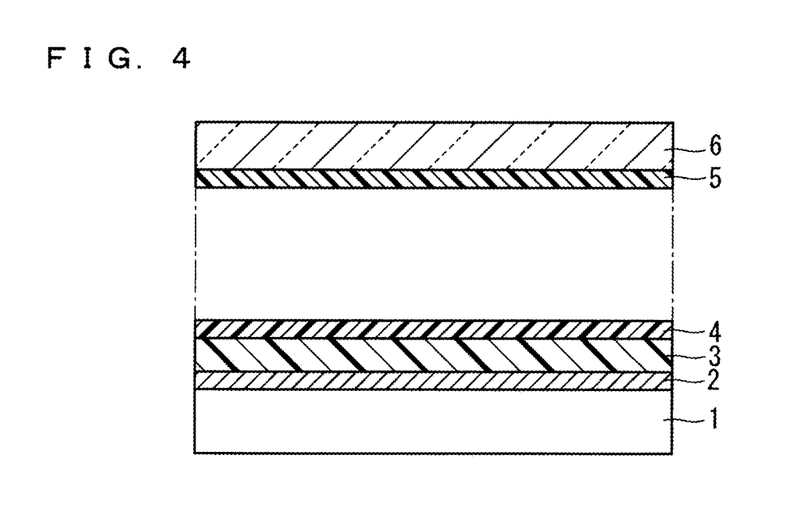
FIG. 4 A cross-sectional view illustrating the manufacturing steps for the semiconductor element according to Embodiment 1.

Then, as illustrated in FIG. 4, a peeling layer 5 is formed on the support substrate 6 separately from the semiconductor substrate 1 processed in the previous steps to form a first structure (Step S2 in FIG. 1). The peeling layer 5 includes, for example, an adhesive composed of a resin made of an organic solvent and a carbon material that absorbs heat and thermally decomposes when being photoirradiated. The peeling layer 5 is formed by, for example, applying by a spin coating method, a printing method, a spray method, or the like, and then heating and drying. For the support substrate 6, a hard and light-transmitting wafer such as non-alkali glass or sapphire glass is used.

Further, as illustrated in FIG. 4, a second structure in which the adhesive layer 4 is formed on the adhesive protective layer 3 is formed (Step S2 in FIG. 1). In Embodiment 1, the adhesive layer 4 includes an adhesive composed of an ultraviolet curable resin such as urethane acrylate, acrylic resin acrylate, and epoxy acrylate and an organic solvent. The adhesive layer 4 is formed by, for example, applying by a spin coating method, a printing method, a spray method, or the like, and then heating and drying.

Figure 5:
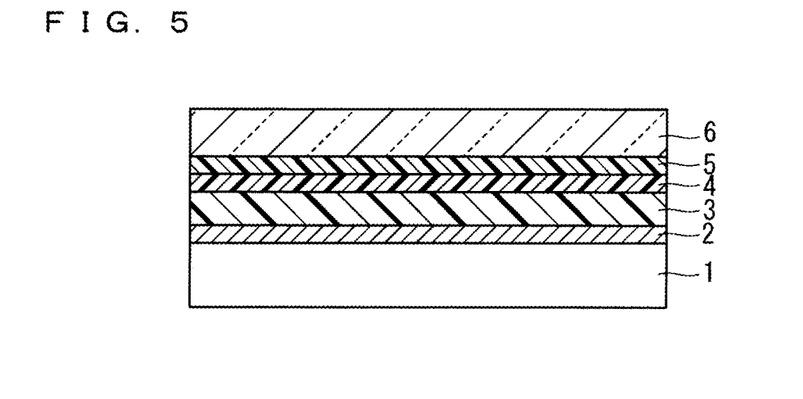
FIG. 5 A cross-sectional view illustrating the manufacturing steps for the semiconductor element according to Embodiment 1.

Then, as illustrated in FIG. 5, the first structure and the second structure overlap with each other to bring the peeling layer 5 and the adhesive layer 4 into contact with each other. In that state, the first structure and the second structure are adhered and bonded together by irradiating the adhesive layer 4 with ultraviolet rays from the light-transmitting support substrate 6 side to resin cure the adhesive layer 4 (Step S3 in FIG. 1).

The adhesive layer 4 is not required to contain an ultraviolet curable resin. However, when the adhesive layer 4 contains an ultraviolet curable resin as in Embodiment 1, the adhesive layer 4 can be cured in a relatively short time, so that the shortening of processing time and the suppression of misalignment in positioning can be expected.

At the time of the above adhesion (bonding), if air or the like is trapped in the adhesive layer 4 and the peeling layer 5, the portion will be an unbonded portion and cause a decrease in the bonding strength. Therefore, when the adhesive layer 4 and the peeling layer 5 are degassed in a vacuum before adhesion, and then adhesion is performed, the unbonded portions can be reduced, so that a decrease in adhesive strength is suppressed.

As described above, a laminated body in which the adhesive protective layer 3, the adhesive layer 4, the peeling layer 5, and the support substrate 6 are disposed in this order on the first main surface of the semiconductor substrate 1 on which the plurality of circuit elements 2 are formed is formed. The formation of this laminated body is not limited to the above. For example, the laminated body may be formed by forming the adhesive protective layer 3, the adhesive layer 4, the peeling layer 5, and the support substrate 6 in this order on the first main surface of the semiconductor substrate 1.

Figure 6:
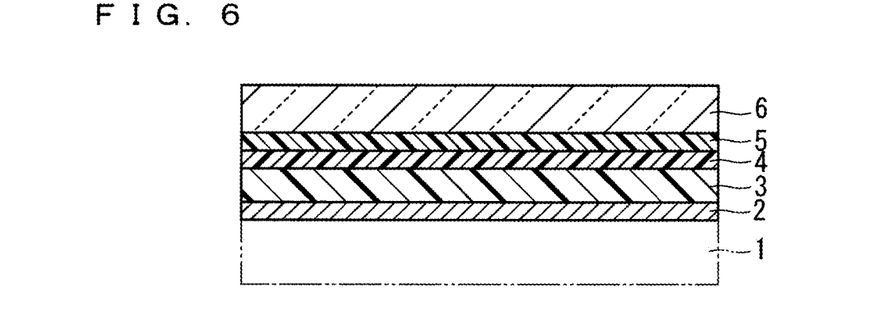
FIG. 6 A cross-sectional view illustrating the manufacturing steps for the semiconductor element according to Embodiment 1.

Next, as illustrated in FIG. 6, the semiconductor substrate 1 other than the portion where the plurality of circuit elements 2 are formed is removed by thinning, including polishing, the semiconductor substrate 1 from the second main surface (rear surface) opposite to the first main surface (Step S4 in FIG. 1).

The thickness of the semiconductor substrate 1 before polishing is, for example, 500 µm, and the thickness of the semiconductor substrate 1 after polishing is, for example, 20 µm. As a polishing method of the semiconductor substrate 1, for example, mechanical polishing, chemical polishing, mechanical chemical polishing and the like are adopted. Then, for example, the semiconductor substrate 1 is further thinned by dry etching such as reactive ion etching (RIE) to reduce the thickness of the semiconductor substrate 1 to, for example, 10 µm.

Figure 7:
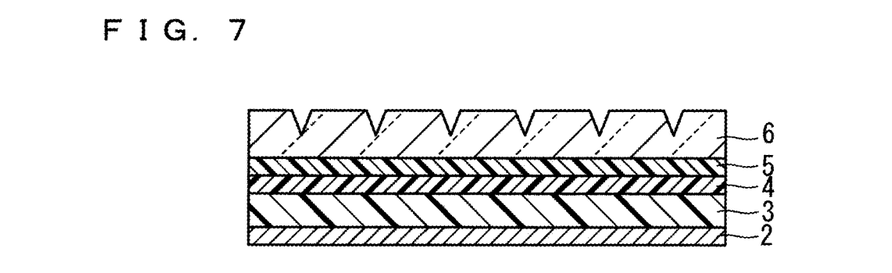
FIG. 7 A cross-sectional view illustrating the manufacturing steps for the semiconductor element according to Embodiment 1.
Figure 8:
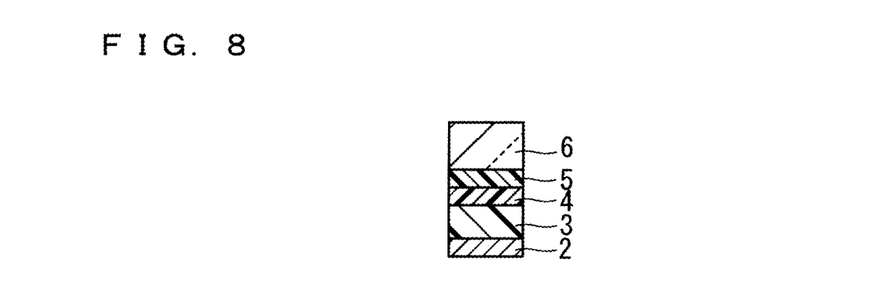
FIG. 8 A cross-sectional view illustrating the manufacturing steps for the semiconductor element according to Embodiment 1.

Then, as illustrated in FIGS. 7 and 8, the plurality of circuit elements 2, the adhesive protective layer 3, the adhesive layer 4, the peeling layer 5, and the support substrate 6 are divided into chips by a division step (cutting step) by dicing or the like (Step S5 in FIG. 1). Accordingly, each of the plurality of circuit elements 2 is individualized. As a dicing method, for example, mechanical dicing using a dicing blade, laser dicing, plasma dicing and the like are adopted.

Here, in a manufacturing method in which the adhesive protective layer 3 is not provided, the semiconductor substrate 1 holding the plurality of circuit elements 2 is mostly removed, so that the film strength is lowered and a force to deform due to residual film stress acts. For this reason, cracks, peeling, chipping, and the like, of the film may occur during the dividing process and the like, and the circuit elements 2 may become defective. However, in Embodiment 1, the thinned circuit elements 2 are firmly adhered to the adhesive protective layer 3, and the film strength of the circuit elements 2 and the like is enhanced by the adhesive protective layer 3, so that deformation of the circuit elements 2 by the residual film stress is suppressed. Therefore, the suppression of defects in the circuit elements 2 due to cracks, peeling, and chipping in the division step and the like, and eventually defects in the semiconductor element is ensured.

Figure 9:
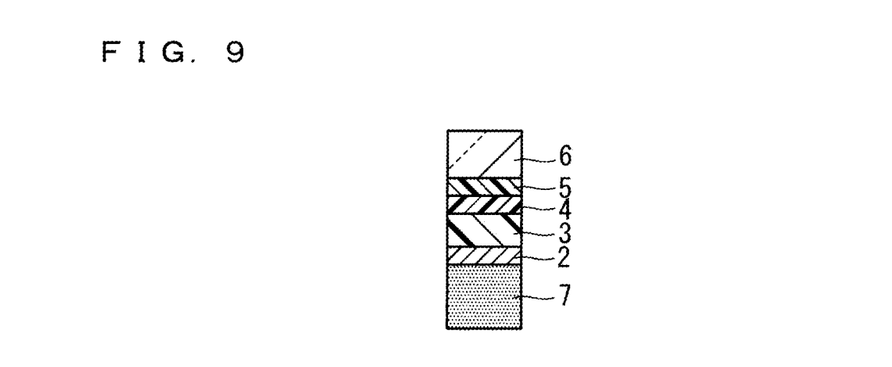
FIG. 9 A cross-sectional view illustrating the manufacturing steps for the semiconductor element according to Embodiment 1.

Next, as illustrated in FIG. 9, the portion where the circuit elements 2 are formed is bonded to the transfer substrate 7 for heat dissipation (Step S6 in FIG. 1). In Embodiment 1, the circuit elements 2 are bonded to the transfer board 7 for each individualized circuit element 2. As the transfer substrate 7, for example, a substrate in which a diamond layer having a thickness of 100 µm is formed on a silicon substrate and the surface roughness (for example, root mean square roughness Rq) of the diamond layer is reduced to 1 nm or less by precision polishing is adopted.

For bonding the circuit elements 2 and the transfer substrate 7, for example, normal temperature bonding is adopted. Specifically, in the vacuum chamber, the polished surface on the circuit element 2 side and the diamond bonding surface on the transfer substrate 7 side are irradiated with an argon ion beam to remove (clean) the oxides on those surfaces. Subsequently, the surfaces from which the oxides have been removed are aligned with each other, and the surfaces are brought into contact with each other and pressed in a vacuum to perform normal temperature bonding. The normal temperature bonding excels in that deformation such as warpage of the circuit elements 2 can be suppressed because heating that generates temperature stress is not required for the support substrate 6 and the transfer substrate 7.

Then, through the steps described below (Steps S7 to S9 in FIG. 1), the support substrate 6, the peeling layer 5, the adhesive layer 4, and the adhesive protective layer 3 are peeled (removed) from the structure formed in the previous steps.

Figure 10:
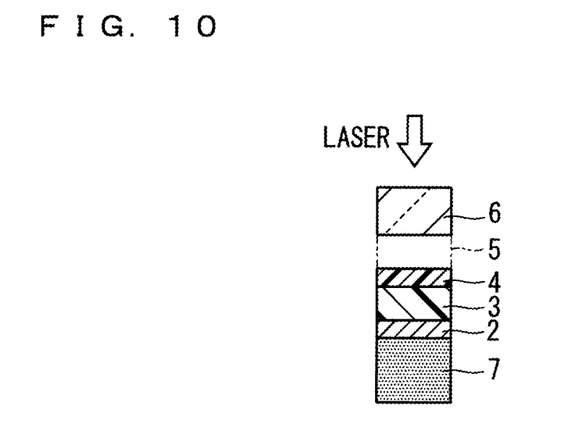
FIG. 10 A cross-sectional view illustrating the manufacturing steps for the semiconductor element according to Embodiment 1.

First, as illustrated in FIG. 10, the peeling layer 5 and the support substrate 6 are peeled by photoirradiation of the peeling layer 5 to thermally decompose thereof (Step S7 in FIG. 1). In Embodiment 1, the resin of the peeling layer 5 is thermally decomposed by photoirradiation of the structure formed in the previous steps from the support substrate 6 side, and the support substrate 6 together with the peeling layer 5 are peeled off. For the photoirradiation, for example, a laser that scans the entire surface of the peeling layer 5 is employed. By irradiating the peeling layer 5 with a laser, carbon and the like in the peeling layer 5 absorb light, are heated, and are thermally decomposed. As a result, the adhesion (adhesiveness, adhesive strength, degree of adhesiveness) between the support substrate 6 and the adhesive layer 4 is reduced, so that the peeling layer 5 and the support substrate 6 can be easily peeled off.

Figure 11:
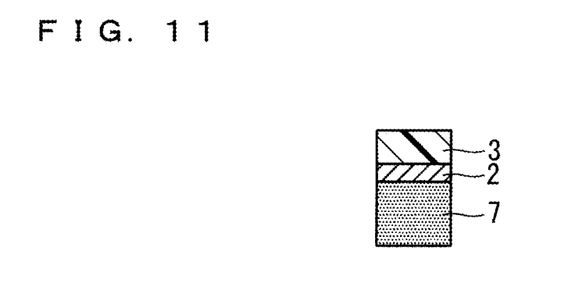
FIG. 11 A cross-sectional view illustrating the manufacturing steps for the semiconductor element according to Embodiment 1.

Next, as illustrated in FIG. 11, the adhesive layer 4 is peeled off by heat treatment (Step S8 in FIG. 1). The adhesive layer 4 is firmly adhered to the adhesive protective layer 3; therefore, the adhesive layer 4 cannot be peeled off with an adhesive tape. Therefore, heat treatment is performed in order to reduce the adhesion between the adhesive layer 4 and the adhesive protective layer 3 to peel them off. By the heat treatment, the organic component is released as a gas from the adhesive layer 4 and the adhesive protective layer 3, and the adhesion between the adhesive layer 4 and the adhesive protective layer 3 is reduced, so that the adhesive layer 4 can be peeled off.

The temperature of the heat treatment may be equal to or higher than the curing temperature at which the adhesive protective layer 3 is formed. For example, when the adhesive protective layer 3 cured at 90° C. using a hot plate in Step S1 is heated on the hot plate set at 200° C. for 10 minutes, the adhesive layer 4 can be easily peeled off. When the heating temperature for peeling the adhesive layer 4 is lower than 150° C., the gas is released so little that the above adhesion does not decrease significantly, and a large force is required to peel the adhesive layer 4. Meanwhile, when the heating temperature for peeling the adhesive layer 4 exceeds 220° C. in a large degree, the circuit element 2 is deformed such as warped, which causes damage or cracks in the subsequent peeling step. Therefore, the heating temperature for peeling the adhesive layer 4 is preferably 170 to 220° C., for example. By attaching an adhesive tape to the adhesive layer 4 after the heat treatment, the adhesive layer 4 can be easily peeled off without residue.

Figure 12:
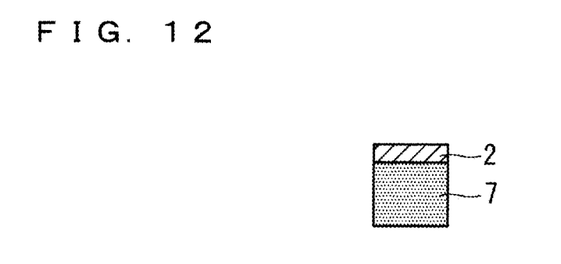
FIG. 12 A cross-sectional view illustrating the manufacturing steps for the semiconductor element according to Embodiment 1.

Finally, as illustrated in FIG. 12, the adhesive protective layer 3 is peeled off by chemical treatment (Step S9 in FIG. 1). The peeling is performed by immersing the adhesive protective layer 3 in a peeling solution such as an alkaline, acidic, or organic solvent and decomposing thereof. After removing the adhesive protective layer 3, the semiconductor elements can be produced by cleaning and drying the semiconductor elements composed of the circuit elements 2 and the transfer substrate 7.

<Summary of Embodiment 1>

According to the method of manufacturing a semiconductor element according to Embodiment 1 as described above, defects of a semiconductor element such as a high-frequency device element can be suppressed by forming the adhesive protective layer 3.

Embodiment 2

Figure 13:
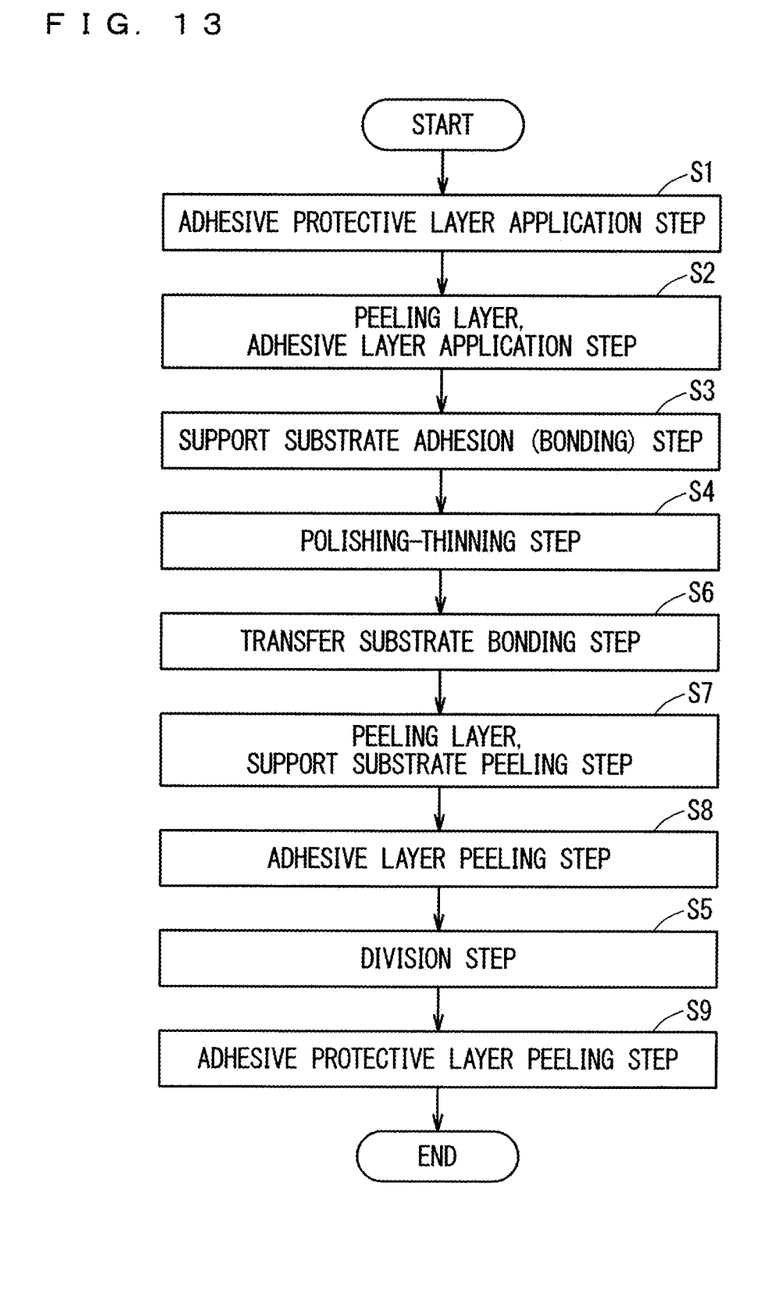
FIG. 13 A flowchart illustrating manufacturing steps for a semiconductor element according to Embodiment 2.

Next, a method of manufacturing a semiconductor device according to Embodiment 2 will be described. FIG. 13 is a flowchart illustrating manufacturing steps for a semiconductor element according to Embodiment 2, and FIGS. 14 to 17 are cross-sectional views illustrating each of the manufacturing steps. Hereinafter, of the components according to Embodiment 2, the same or similar reference numerals are given to the same or similar components as those described above, and different components will be mainly described.

The manufacturing steps of FIG. 13 are the same as the manufacturing steps in which Step S5 is moved between Steps S8 and S9 in the manufacturing steps of Embodiment 1 (FIG. 1). In Embodiment 2 followings are performed: formation of an adhesive protective layer and an adhesive layer on a semiconductor substrate on which a plurality of circuit elements are formed, adhesion (bonding) of the adhesive layer and a support substrate to each other, substrate thinning (polishing), bonding of a transfer substrate, peeling of the support substrate, peeling of the adhesive layer, division (cutting) by dicing or the like, and peeling of the adhesive protective layer, in this order.

In Embodiment 2, first, in Steps S1 to S4 of FIG. 13, the same steps as the Steps S1 to S4 of FIG. 1 (Steps of FIGS. 2 to 6) described in Embodiment 1 are performed. Then, Steps similar to Steps S6 to S8 of FIG. 1 described in Embodiment 1 are performed. Hereinafter, only the main contents on Steps following Step S6 will be described.

Figure 14:
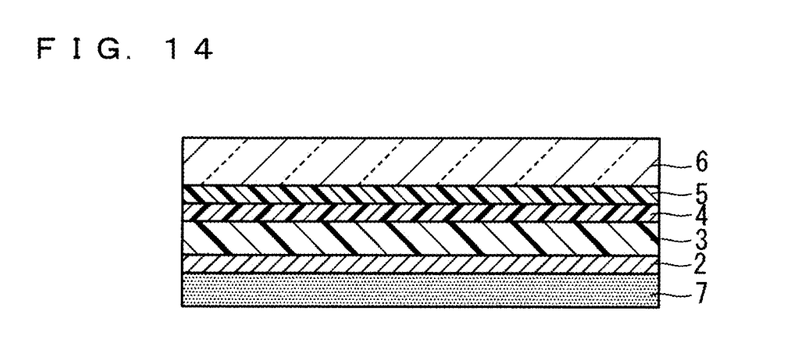
FIG. 14 A cross-sectional view illustrating the manufacturing steps for the semiconductor element according to Embodiment 2.
Figure 15:
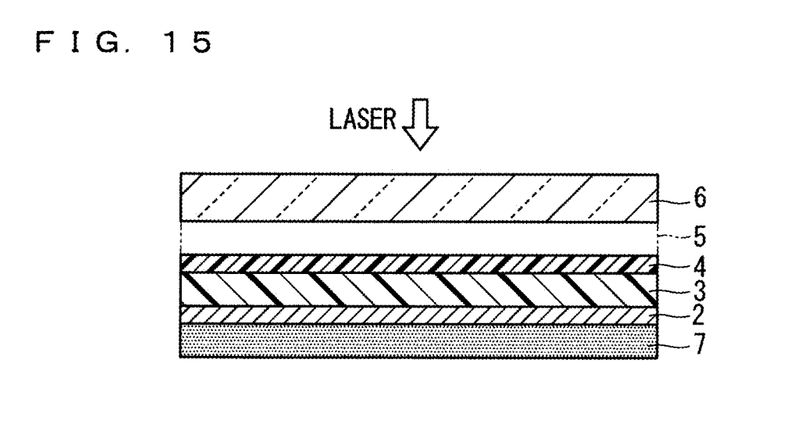
FIG. 15 A cross-sectional view illustrating the manufacturing steps for the semiconductor element according to Embodiment 2.
Figure 16:
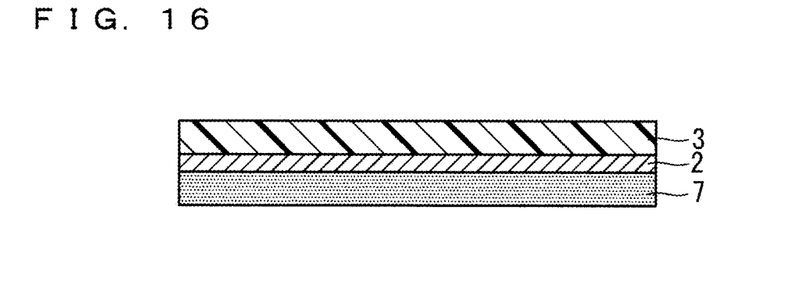
FIG. 16 A cross-sectional view illustrating the manufacturing steps for the semiconductor element according to Embodiment 2.

First, as illustrated in FIG. 14, the portion where the plurality of circuit elements 2 are formed is bonded to the transfer substrate 7 for heat dissipation (Step S6 in FIG. 13). For bonding the circuit elements 2 and the transfer substrate 7, for example, normal temperature bonding is adopted. Next, as illustrated in FIG. 15, of the structure formed in the previous steps, the peeling layer 5 and the support substrate 6 are peeled by photoirradiation of the peeling layer 5 to thermally decompose thereof (Step S7 in FIG. 13). Then, as illustrated in FIG. 16, the adhesive layer 4 is peeled off by heat treatment (Step S8 in FIG. 13).

Figure 17:
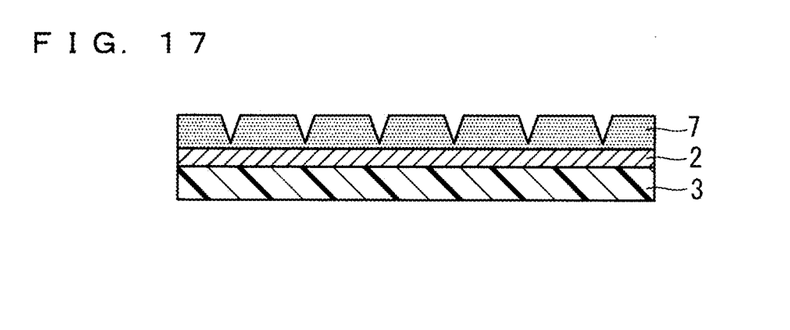
FIG. 17 A cross-sectional view illustrating the manufacturing steps for the semiconductor element according to Embodiment 2.

Next, as illustrated in FIGS. 17 and 11, the plurality of circuit elements 2, the adhesive protective layer 3, and the transfer substrate 7 are divided into chips by a division step (cutting step) by dicing or the like (Step S5 in FIG. 13). For dicing, for example, laser dicing that irradiates a laser from the transfer substrate 7 is employed. This is because the transfer substrate 7 made of a diamond layer having high hardness cannot be divided (cut) by the mechanical dicing method using a dicing blade. It should be noted that, it can be considered that the relatively large output power of the laser may affect the circuit elements 2. Therefore, performing the division step before the removal of the adhesive protective layer 3 suppresses damage such as chipping and cracks of the circuit elements 2 with the adhesive protective layer 3. However, if the influence of the laser power on the circuit element 2 is small, the division step may be performed after the adhesive protective layer 3 is removed.

Finally, as illustrated in FIG. 12, the adhesive protective layer 3 is peeled off by chemical treatment (Step S9 in FIG. 13); thereby, the semiconductor elements composed of the circuit elements 2 and the transfer substrate 7 are produced.

<Summary of Embodiment 2>

As in the same with Embodiment 1, defects of a semiconductor element such as a high-frequency device element can also be suppressed by forming the adhesive protective layer 3 in Embodiment 2.

Also, in Embodiment 1, the transfer substrate 7 having the same size as the circuit element 2 is bonded to the circuit element 2 which has been made into individual chips by the dividing step (FIG. 9). Meanwhile, in Embodiment 2, the transfer substrate 7 is first bonded to the circuit elements 2, the adhesive layer 4 and the like are peeled off, and then the division step is performed. According to the manufacturing method of Embodiment 2 as described above, for example, the plurality of circuit elements 2 can be collectively bonded to the transfer substrate 7. Therefore, the processing time can be shortened and the support substrate 6 will be reusable, so that the processing cost can be reduced. Further, the processing cost can be reduced from the viewpoint that the diamond layer, which is the transfer substrate 7 for heat dissipation, can be uniformly processed on the large substrate. Further, the peeling step of the peeling layer 5 and the adhesive layer 4 can be performed collectively; therefore, the film strength of the circuit elements 2 at the time of peeling is enhanced, comparing with the case where the layers are peeled from the circuit elements 2 which have been made into individual chips. Therefore, suppression of the circuit element 2 from being damaged in the peeling step is ensured.

Embodiment 3

The adhesive layer 4 and the adhesive protective layer 3 are firmly adhered to each other and hardly peeled off during the polishing and dividing steps; therefore, damages and the like of the circuit elements 2 are not caused. However, the adhesive layer 4 does not easily peel off, and cannot be easily peeled off by the peeling method with a peeling tape sticking thereon. Therefore, in the heat treatment of Step S8 (FIGS. 1 and 13) of Embodiments 1 and 2, the organic solvent component is released from the adhesive protective layer 3, and the bonding force at the interface between the adhesive layer 4 and the adhesive protective layer 3 is reduced; therefore, peeling of the adhesive layer 4 by the peel method or the like is ensured.

Now, most of the organic component of the adhesive protective layer 3 evaporates in the forming step thereof, but it does not evaporate completely, and it evaporates almost completely by heating at an even higher temperature. The organic solvent having a boiling point of 120 to 200° C. is assumed to be used for the adhesive protective layer 3. The use of the organic solvent having a relatively low boiling point for the adhesive protective layer 3 reduces the adhesive protective layer 3 that contributes to the peeling of the adhesive layer 4. Meanwhile, the use of the organic solvent having a high boiling point for the adhesive protective layer 3 forms the adhesive protective layer 3 having low film strength because the organic solvent does not evaporate unless the drying temperature is raised.

Therefore, in Embodiment 3 of the present invention, the adhesive protective layer 3 contains a plurality of types of organic solvent components having different boiling points. As a result, the solvent having a high boiling point remains more than the solvent having a low boiling point even at the same drying temperature, increasing the amount of organic components of the adhesive protective layer 3 that evaporates when the adhesive layer 4 is peeled off; therefore, the peeling of the adhesive layer 4 is easily performed. Meanwhile, the adhesive protective layer 3 having high film strength can be formed. For the organic solvent of the adhesive protective layer 3, a solvent in which two or more types of following solvents are mixed, for example, polypropylene glycol, monomethyl ether, 3-methoxybutyl acetate, ethyl lactate, 2-ethoxyethyl acetate, N-butyl acetate, xylene, toluene and the like is used.

<Summary of Embodiment 3>

According to the method of manufacturing the semiconductor device according to Embodiment 3 as described above, the adhesive layer 4 can be peeled off more easily.

<Modification>

In the manufacturing method of Embodiment 1 (FIG. 1), the dividing step (Step S5) is performed between the thinning step (Step S4) including polishing of the semiconductor substrate 1 and the joining step (Step S6) of the transfer substrate 7. In the manufacturing method of Embodiment 2 (FIG. 13), the dividing step (Step S5) is performed between the peeling step (Step S8) of the adhesive layer 4 and the peeling step (Step S9) of the adhesive protective layer 3. However, the present invention is not limited thereto, and the dividing step (Step S5) may be performed after the thinning step (Step S4).

It should be noted that Embodiments of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

EXPLANATION OF REFERENCE SIGNS 1 semiconductor substrate, 2 circuit element, 3 adhesive protective layer, 4 adhesive layer, 5 peeling layer, 6 support substrate, 7 transfer substrate.

The invention claimed is:

1. A method of manufacturing a semiconductor element, comprising:
    a step (a) of forming a laminated body in which an adhesive protective layer, an adhesive layer, a peeling layer, and a support substrate are disposed in this order on a first main surface of a semiconductor substrate on which a plurality of circuit elements are formed;
    a step (b) of removing the semiconductor substrate other than a portion where the plurality of circuit elements are formed, by polishing the semiconductor substrate from a second main surface opposite to the first main surface;
    a step (c) of bonding the portion where the plurality of circuit elements are formed to a transfer substrate;
    a step (d) of removing the peeling layer and the support substrate by photoirradiation of the peeling layer;
    a step (e) of removing the adhesive layer by heat treatment;
    a step (f) of removing the adhesive protective layer by chemical treatment; and
    a step (g) of dividing the plurality of circuit elements,
    a temperature of the heat treatment in the step (e) is higher than a temperature for forming the adhesive protective layer in the step (a).

2. The method of manufacturing the semiconductor element according to claim 1, wherein
    the step (g) is performed between the step (b) and the step (c) or between the step (e) and the step (f).

3. The method of manufacturing the semiconductor element according to claim 1, wherein
    the circuit elements include an electrode having an air bridge structure.

4. The method of manufacturing the semiconductor element according to claim 1, wherein
    the step (c) includes normal temperature bonding in which the circuit elements are bonded to the transfer substrate.

5. The method of manufacturing the semiconductor element according to claim 1, wherein
    the adhesive protective layer contains a plurality of types of organic solvent components having different boiling points.

6. The method of manufacturing the semiconductor element according to claim 1, wherein
    the adhesive layer contains an ultraviolet curable resin.

7. The method of manufacturing the semiconductor element according to claim 1, wherein the portion is in contact with the transfer substrate after bonding.

8. The method of manufacturing the semiconductor element according to claim 1, wherein, in step (b), the portion of the semiconductor substrate that is not removed is 20 μm thick.

9. The method of manufacturing the semiconductor element according to claim 1, wherein the support substrate includes a light transmitting material.

10. The method of manufacturing the semiconductor element according to claim 9, wherein the light transmitting material includes a non-alkali glass or a sapphire glass.

11. The method of manufacturing the semiconductor element according to claim 1, wherein, in step (a), the adhesive layer and the peeling layer are degassed in a vacuum before being adhered to each other.

12. The method of manufacturing the semiconductor element according to claim 1, wherein, in step (b), the polishing includes mechanical polishing, chemical polishing, or mechanical chemical polishing.

13. The method of manufacturing the semiconductor element according to claim 1, wherein, in step (b), reactive ion etching is performed on the semiconductor substrate after polishing.

14. The method of manufacturing the semiconductor element according to claim 1, wherein step (g) is performed by using a dicing blade, laser dicing, or plasma dicing.

15. The method of manufacturing the semiconductor element according to claim 1, wherein the transfer substrate includes a diamond layer formed on a silicon substrate.

16. The method of manufacturing the semiconductor element according to claim 15, wherein the diamond layer of the transfer substrate and the portion of the semiconductor substrate are irradiated with an argon ion beam prior to being bonded together in step (c).

17. The method of manufacturing the semiconductor element according to claim 9, wherein, in step (d) the irradiation is performed through the support substrate.

18. The method of manufacturing the semiconductor element according to claim 2, wherein the transfer substrate includes a diamond layer and step (g) is performed using laser dicing.

19. The method of manufacturing the semiconductor element according to claim 18, wherein the laser dicing is performed through the support substrate.

* * * * *